United States Patent [19]

Ing

[11] 4,016,310
[45] Apr. 5, 1977

[54] COATER HARDWARE AND METHOD FOR OBTAINING UNIFORM PHOTOCONDUCTIVE LAYERS ON A XEROGRAPHIC PHOTORECEPTOR

[75] Inventor: Samuel W. Ing, Webster, N.Y.

[73] Assignee: Xerox Corporation, Stamford, Conn.

[22] Filed: Apr. 23, 1975

[21] Appl. No.: 571,047

[52] U.S. Cl. .................... 427/251; 96/1.5; 427/81; 427/124; 427/248 G; 427/295; 427/425; 96/1.8

[51] Int. Cl.[2] .......................... C23C 13/02

[58] Field of Search .......... 427/50, 51, 91, 99, 427/124, 295, 248 A, 248 G, 81, 238, 251; 96/1.5, 1.8; 23/294 R, 273 MT, 273 SP

[56] References Cited

UNITED STATES PATENTS

| 2,967,095 | 1/1961 | Herrick | 23/273 SP |
|---|---|---|---|
| 3,081,201 | 3/1963 | Koller | 427/251 |
| 3,119,713 | 1/1964 | Hannahs | 427/251 |
| 3,303,550 | 2/1967 | Banzhof | 427/50 |
| 3,307,936 | 3/1967 | Smith, Jr. | 427/251 |
| 3,476,525 | 11/1969 | Allen | 23/294 |
| 3,615,275 | 10/1971 | Turk | 427/251 |

Primary Examiner—John D. Welsh
Attorney, Agent, or Firm—James J. Ralabate; James P. O'Sullivan; John E. Crowe

[57] ABSTRACT

A method and device for obtaining uniform vapor deposition of one or more inorganic metallic photoconductive materials onto a substrate by importing under vacuum a slow translational movement of one or more heated crucibles and/or of the substrate being coated.

15 Claims, 6 Drawing Figures

US Patent   April 5, 1977   Sheet 1 of 2   4,016,310
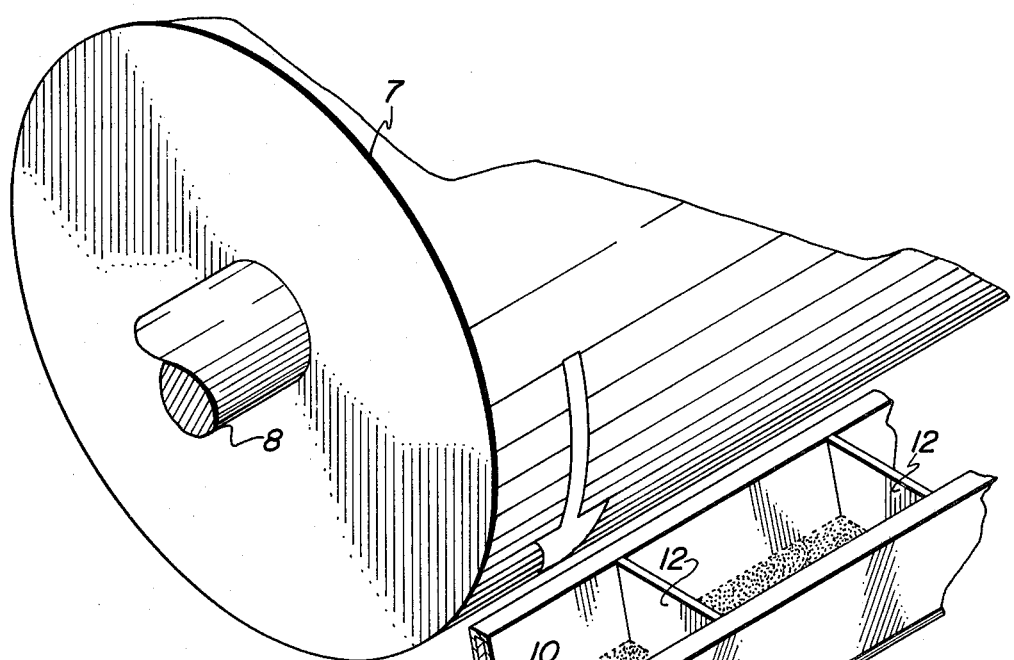
FIG. 1
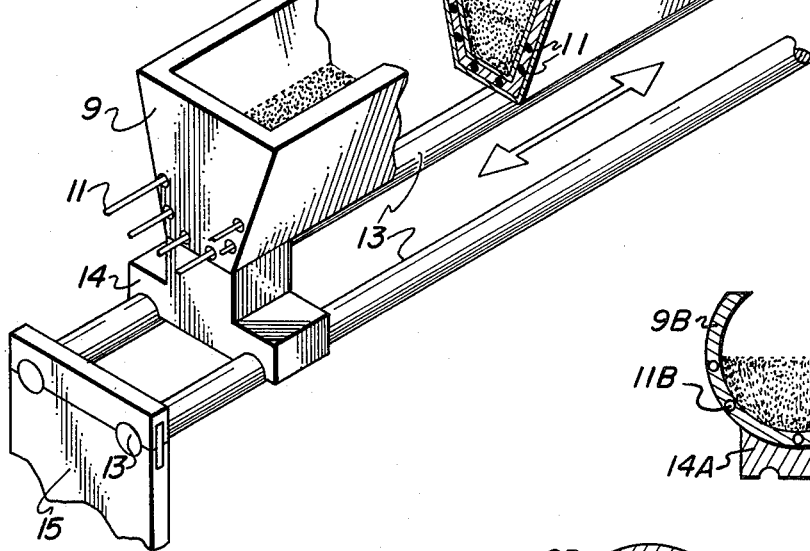
FIG. 2
FIG. 3   FIG. 4   FIG. 5

COATER HARDWARE AND METHOD FOR OBTAINING UNIFORM PHOTOCONDUCTIVE LAYERS ON A XEROGRAPHIC PHOTORECEPTOR

This invention relates to a device and method for obtaining a more uniform vapor deposition of inorganic metallic coating material such as photoconductive material onto a suitably prepared receiving surface such as a substrate by varying the position of the vapor source with respect to the receiving surface.

BACKGROUND

It is customary in the xerographic art to form an electrostatic latent image on a photoreceptor drum or plate comprising a charge conductive backing such as, for example, a metallic or metal coating surface having a photoconductive insulating layer applied thereto in good charge blocking contact. A suitable device for this purpose comprises, for example, an aluminum plate having a thin layer of vitreous selenium and an aluminum oxide and/or polymeric interlayer. Such a plate is characterized by being capable of excepting a suitable electrostatic charge and of quickly and selectively dissipating a substantial part of the charge where light is exposed. In general, such photoreceptors are sensitive to light in the blue-green spectral range.

While selenium containing photoconductive elements are usefully employed in commercial xerography, there is room for substantial improvement in photoconductive properties such as the range of spectral response, heat and charge stability, etc. These can be improved by the addition of various photoconductive alloys, alloying elements or other types of additives (ref. U.S. Pat. Nos. 2,803,542 and 2,822,300). For example, the addition of various amounts of arsenic can result in a broader range of spectral sensitivity and improve overall photographic speed and stability. Suitable alloys or homogeneous mixtures of elemental selenium with other metals suitable for this purpose can also be incorporated into the usual photoconductive material by conventional vacuum evaporation techniques. For example, additional inorganic coating materials can be placed in open or shuttered crucibles in a vacuum during an initial coating step. The xerographic substrate upon which the photoconductive material is to be deposited is conveniently placed above or in some other convenient location with respect to the potential coating vapor source. After the container has been evacuated to a suitable pressure (about $5 \times 10^{-5}$ Torr), the vessel containing photoconductive material and/or additive is then heated by suitable means known to the art such as by electric resistance heating elements to promote vaporization of the material. At least some of the vaporized material then condenses on the relatively cool substrates; such a deposition process normally requires a period of about 15–60 minutes, depending upon the amount of substrate surface to be coated and the desired thickness of coating material.

From time to time it is also found desirable to apply profile concentrations of one or more photoconductive components or separate layers of different photoconductive materials to obtain a particular desired spectrum of characteristics. In such case, the respective photoconductive materials or alloys are most conveniently applied to substrates or bases by coevaporation techniques, in which predetermined amounts of the respective photoconductive materials or alloys are placed in separate crucibles or in subdivided crucibles and exposed or heated in a predetermined sequence under vacuum. One very useful modification for this purpose involves coating in the presence one or a plurality of elongated crucibles heated by electrical heating elements or by other conventional means, the crucibles being subdivided into a plurality of compartments or bins, each capable or carrying different amounts and kinds of coating materials depending upon the desired final concentration. Another useful modification involves the formation of one or more trains of small crucibles temporarily connected to each other and containing various photoconductive materials. Both arrangements are found to be very useful in coating a plurality of substrates simultaneously with a plurality of components.

Unfortunately, however, the use of such crucibles separated by baffles or end walls also presents serious technical problems insofar as it is difficult to control surface irregularities and achieve consistency during batch coating. This is found to be due largely to variation in the geometric relation of substrates to crucible bins and particularly attributable to the presence of crucible end walls or baffles. Such coating irregularities, in turn, usually cause unacceptable variations in electronic properties both between and within the individual photoreceptors being batch produced.

It is an object of the present invention to develop a method and equipment for efficiently and evenly batch coating one or more receiving surfaces or prepared substrates with one or more coating materials or components thereof.

It is also an object of the present invention to minimize or avoid irregularities when batch coating one or more inorganic photoconductive materials onto prepared xerographic substrates in a vacuum coater.

A still further object relates to obtaining an improved method for improvement quality of batch coated xerographic photoreceptors containing one or more photoconductive components.

THE INVENTION

The above and other objects are achieved in accordance with the present invention wherein receiving surface, inclusive of xerographic substrates or bases, are batch coated with at least one vaporizable coating material or component thereof and applied under vacuum from one or more evaporation crucibles containing a plurality of subdivisions delimited by baffles or end plates and crucible walls, and arranged in convenient proximity to the receiving surfaces.

The process as envisioned requires the steps of heating one or more material-containing crucibles simultaneously or in sequence while moving at least one of said (a) crucibles or said (b) receiving surfaces in a translational manner along parallel planes with respect to each other.

A particularly suitable batch coating device within the scope of this invention for achieving the above objects and described process (i.e. vacuum coating vaporizable coating materials or components thereof onto receiving surfaces) comprises, in combination, a. one or more evaporation crucibles arranged within a vacuum coater in convenient proximity to receiving surfaces to be coated, said crucibles being elongated and having a plurality of subdivisions delimited by baffles or end plates and crucible side walls;

b. mounting means for movably holding receiving surfaces in the same parallel planes within the vacuum coater in convenient proximity to the crucibles and coating material;

c. supporting means for movably supporting one or more crucibles in the same or parallel planes within the vacuum coater at points below the mounted receiving surfaces;

d. heating means arranged for separately or concurrently vaporizing coating material from all or subdivisions of each crucible as desired; and e. means for moving one or both of said crucibles and said receiving surfaces within the vacuum coater in a translational manner during coating.

The device, as described, is best utilized for coating coating material or components thereof onto mounted receiving surfaces by heating one or more of the crucibles under vacuum and moving at least one of said (1) crucibles and said (2) receiving surfaces in translational movement along parallel planes with respect to each other.

DESCRIPTION OF DRAWINGS

The concept as envisioned is further described with respect to essential components of a suitable batch coating device although not limited thereby. FIG. 1 is an isometric fragmentary view, FIGS. 2—5 are orthographic cross-sectional views and FIG. 6 is a three-dimensional or perspective view of representative components of the present invention.

In particular, FIG. 1 is illustrative of a suitable embodiment of the present invention wherein base member (15) and rails (13) as well as a rotatable or rotating reciprocating spindle 8 are affixed or conveniently mounted within a vacuum coater capable of achieving an atmospheric pressure to about $5 \times 10^{-5}$ Torr in general accordance with known coating procedures. Such general procedure and vacuum coating techniques are described, for instance, in U.S. PAT. Nos. 2,753,278, 2,970,906, 3,311,548 and 3,490,903. Removable elongated evaporation crucibles exemplified by 9 are subdivided by baffles or end plates 12 for holding individual coating compositions or components thereof 10 and equipped with resistance heating elements 11 plus sliding means 14 adapted for a back and forth translational movement along a plane within the coater. Actuation means (not shown) permit movement of crucible 9 back and forth along rails 13 during coating and, if desired, a reciprocating as well as a rotational movement of spindle 8.

Figure 6:
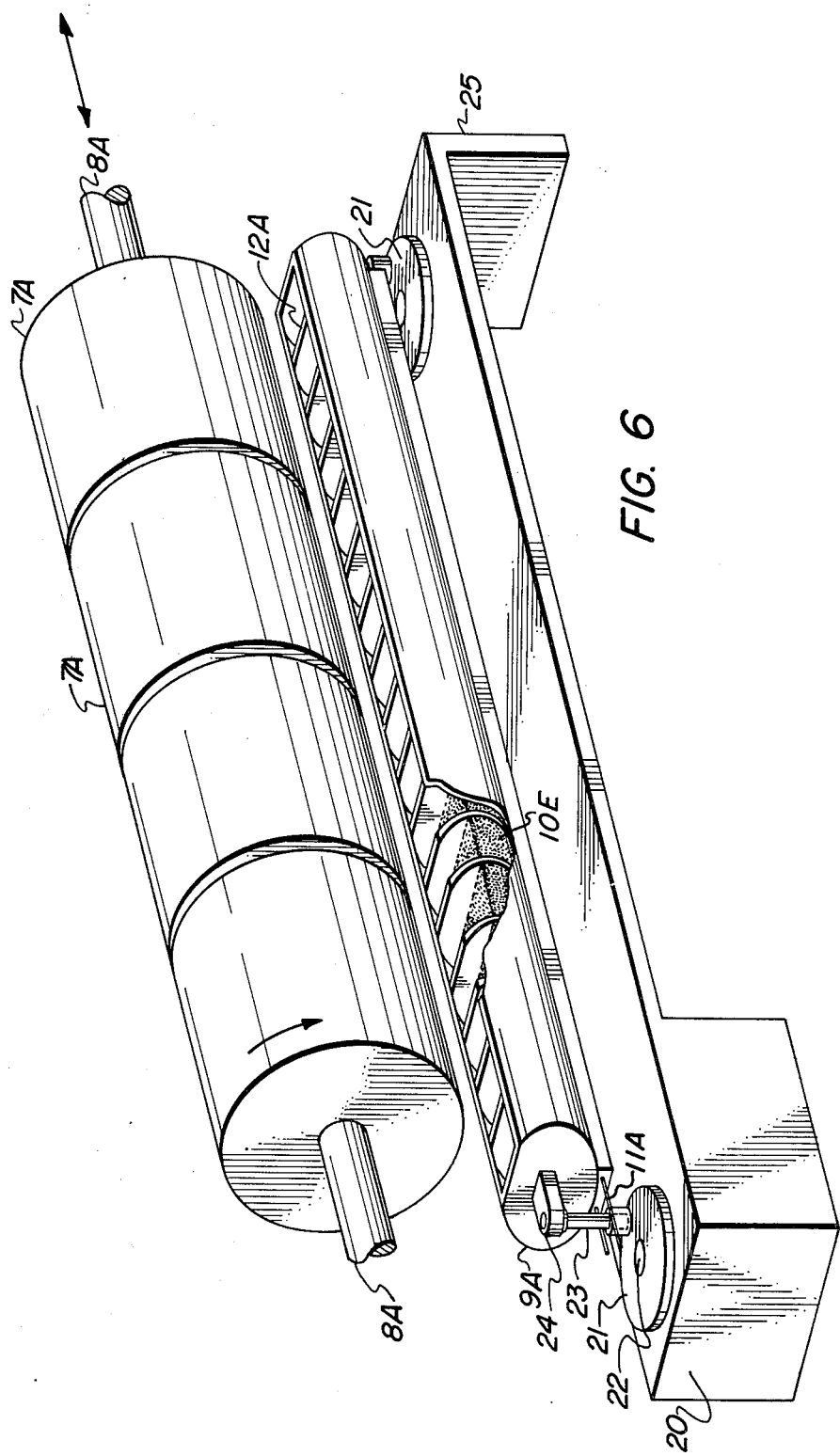

One or more receiving surfaces demonstrated as drums of suitable structural integrity, here shown in the form of mountable drums, 7 are mounted on a metal spindle 8 in convenient proximity to crucible 9. As noted above, the mounted receiving surface or drum can optionally also move in a translational manner as well as rotate about the axis corresponding to spindle 8.

FIGS. 2–5 relate to various modifications of self-heating crucibles showing parts corresponding to FIG. 1 including crucibles 9B–9E, sliding means 14A–14D, coating materials 10A–10D and electrical heating elements 11B–11E. The later elements can be usefully eliminated, if desired, provided the crucible itself comprises a material having sufficient resistivity to act as the heating element.

FIG. 6 exemplifies a further modification within the scope of the present invention in which a crucible 9A containing resistance heating means 11A is mounted on a base 20 containing 21–24 for imparting a rotational translating movement of said crucible in convenient proximity to receiving surfaces shown as a plurality of drums 7A removably mounted on a rotatable spindle 8A having the dual ability to axially rotate and, if desired, to move back and forth in an axial translational direction, the long axis of the crucible being generally parallel with the drum axis or spindle 8A.

Generally speaking, a receiving surface for purposes of the present invention is inclusive of surfaces of plates, flexible belts, drums, sheets, webs or miscellaneous-shaped objects, the only limitation being that the object being coated be sufficiently stable when exposed to heats of vaporization and condensation of the coating material utilized, and that the coating material adequately adhere in stable condition to the surface being coated. In this connection, it is noted that xerographic substrates or base plates such as stainless steel, aluminum, copper, brass, nickel, chromium, metal coated glass or the like having suitable oxide or other intermediate blocking layers and also charge or hole transport layers, if desired, are well suited for covering in the above manner.

The coating materials 10–10E of FIGS. 1-6 represent one or more separate coating materials or components of coating materials of metallic or non-metallic types, the principle criterion being that the material being applied have a sufficiently high vapor pressure under heat and a vacuum (up to about $5 \times 10^{-5}$ Torr in the case of a photoconductive material) to evaporate and condense onto the desired receiving surface within a reasonable time and without undesired chemical changes to the coating material or the receiving surfaces.

Photoconductive materials being applied in the present manner are preferably although not exclusively inorganic photoconductive materials or additives thereof. Suitable materials for coating within the present invention can also include vaporizable monomeric materials for, in situ, polymerization onto a substrate as well as amorphous selenium, various selenium alloys with arsenic and/or tellurium, etc., and optional halogens or sensitizing dyes such as disclosed in U.S. Pat. No. 3,532,496. Such materials can be conveniently placed in adjacent subdivisions of each crucible in sequence below each drum, belt, or plate, etc., to be coated or some even applied in separate adjacent crucibles of a stationary or nonstationary type.

The spindle 8, 8A, end plates 12, 12A, rails 13, and comparable or equivalent means FIG. 6, No. 21–24 are preferably although not exclusively of stainless steel.

For purposes of the present invention it is also useful to include evaporation crucibles of steel, ceramic or comparable materials or either conventional open boat or of a tube type. Such include, for instance, modified crucibles which avoid the risk of spattering of coating material such as described in U.S. Pat. Nos. 3,748,090 and 3,746,502.

It has also been found that the method and device above exemplified and described is best carried out when one or more crucibles are moved in long axial direction with respect to a plurality of stationary receiving surfaces, particularly xerographic substrates or bases although the receiving surfaces, or both crucibles and receiving surfaces, can be moved out of sync to assure adequate coverage. In any case, the movement with respect to the crucibles and receiving surfaces is that of a relative translational motion during deposition. For this purpose, one or more crucibles (or receiving surfaces) can be slowly moved with respect to a plurality of receiving surfaces (or crucibles) as above described, the movement of each crucible (or receiving surface) being about ¼ to about 2 times the long axial distance of a crucible subdivision, preferably being unidirectionally displaced about 1 inch to 6 inches and completing each cycle of movement in about 5 – 60 seconds and particularly 5 – 10 seconds.

A further advantageous arrangement involves arranging the receiving surfaces in the form of drums axially rotatably mounted convenient to at least one crucible, the long axis of each drum being arranged parallel and above the long axis of each crucible.

What is claimed is:

1. A method for batch coating xerographic substrates or bases with at least one vaporizable photoconductive coating material or component thereof applied under vacuum from one or more evaporation crucibles containing a plurality of subdivisions delimited by baffles or end plates and crucible walls and arranged in convenient proximity to the xerographic substrates or bases being coated, comprising heating and vaporizing photoconductive material from one or more crucibles simultaneously or in sequence while moving at least one of said (a) crucibles or said (b) xerographic substrates or bases in a translational manner along parallel planes with respect to each other.

2. The method of claim 1 wherein the heated crucibles, individually contain at least one photoconductive material, the crucibles being moved in long axial direction with respect to a plurality of stationary xerographic substrates or bases.

3. The method of claim 1 wherein the crucibles are stationary and individually contain at least one photoconductive material.

4. The method of claim 1 wherein the heated crucibles individually contain at least one photoconductive material and both the photoconductive materials and xerographic substrates are subject to a relative translational motion during deposition.

5. The method of claim 2 wherein one or more crucibles are slowly moved with respect to a plurality of xerographic substrates or bases, the movement of each crucible being about ¼ to about 2 times the long axial distance of a crucible subdivision.

6. The method of claim 3 wherein each xerographic substrate is slowly moved about ¼ to about 2 times the distance of a stationary crucible subdivision.

7. The method of claim 4 wherein the xerographic substrate and the photoconductive material are moved relative to each other bout ¼ to about 2 times the distance of a crucible subdivision.

8. The method of claim 5 wherein one or more crucibles move unidirectionally about 1 inch to 6 inches and a complete cycle of movement is effected in about 5–60 seconds.

9. The method of claim 6 wherein the substrates or bases move unidirectionally about 1 inch to 6 inches, and a complete cycle of movement is effected in about 5–60 seconds.

10. The method of claim 7 wherein the crucibles and the substrates or bases move unidirectionally about 1 inch to 6 inches, and a complete cycle of movement is effected in about 5–60 seconds.

11. The method of claim 8 wherein a complete cycle of movement is effected in about 5–10 seconds.

12. The method of claim 1 wherein the receiving surfaces are in the form of drums axially rotatably mounted convenient to at least one crucible, the long axis of each drum being arranged parallel and above the long axis of each crucible.

13. The method of claim 2 wherein the xerographic substrates are charge conductive drums, belts, matts or plates.

14. The method of claim 2 wherein the xerographic substrates are charge conductive drums, belts, matts or plates.

15. The method of claim 3 wherein the xerographic substrates are charge conductive drums belts, matts or plates.

* * * * *